United States Patent [19]

Arvanitis et al.

[11] 4,229,718
[45] Oct. 21, 1980

[54] WIDE-BANDWIDTH MONOLITHIC CRYSTAL FILTER

[75] Inventors: Aristotelis S. Arvanitis, Addison; Thomas W. Re, Wheaton; Stanley Malinowski, Park Ridge, all of Ill.

[73] Assignee: Motorola, Inc., Schaumburg, Ill.

[21] Appl. No.: 31,644

[22] Filed: Apr. 19, 1979

[51] Int. Cl.$^2$ .............. H03H 9/04; H03H 9/26; H03H 9/32
[52] U.S. Cl. ........................... 333/192; 310/357; 310/366
[58] Field of Search ........................ 333/188–189, 333/190–192; 310/320–321, 366, 365, 357–362

[56] References Cited

U.S. PATENT DOCUMENTS

| | | | |
|---|---|---|---|
| 3,487,318 | 12/1969 | Herman | 310/320 X |
| 3,517,350 | 6/1970 | Beaver | 333/191 |
| 3,564,463 | 2/1971 | Beaver et al. | 333/191 |
| 3,582,836 | 6/1971 | Kent | 333/191 |
| 3,602,844 | 8/1971 | Sykes | 310/320 |
| 4,163,959 | 8/1979 | Dailing | 333/191 |

OTHER PUBLICATIONS

Beaver–"Theory and Design Principles of the Monolithic Crystal Filter" Lehigh University, 1967; pp. I, IV–XX and 1–50.

*Primary Examiner*—Marvin L. Nussbaum
*Attorney, Agent, or Firm*—Rolland R. Hackbart; James W. Gillman

[57] ABSTRACT

A monolithic crystal filter is disclosed that provides much wider bandwidths than were obtainable by prior art crystal filters. The inventive wide-bandwidth monolithic filter includes a piezoelectric substrate, an output electrode, a plurality of input electrodes arranged in orthogonal relationship with the output electrode and common electrodes disposed opposite to the input and output electrodes. The input and output electrodes are preferably disposed on the substrate along the crystallographic axes thereof. Increased bandwidth is realized due to the increased coupling resulting from the combination of the individual couplings from each input electrode at the output electrode. As a result of the increased coupling provided by the inventive crystal filter, overtone mode operation is now possible at much higher frequencies which heretofore were not obtainable by prior art crystal filters due to impractically close electrode spacing requirements.

8 Claims, 6 Drawing Figures

WIDE-BANDWIDTH MONOLITHIC CRYSTAL FILTER

BACKGROUND OF THE INVENTION

The present invention relates to electrical filters for passing a band of frequencies, and more particularly to wide-bandwidth monolithic crystal filters.

According to the prior art, the passband of a crystal filter may be increased by parallel connecting a number of two-pole crystal filters which each have different center frequencies. A crystal filter of this type is described in U.S. Pat. No. 3,697,788. Other techniques which have provided somewhat greater passbands include reducing the separation between the input and output electrodes while coupling along the X crystallographic axis of the quartz substrate; utilizing single-phase coupling between rectangular electrodes instead of circular electrodes; and combining both of the foregoing techniques with light plateback. However, none of the foregoing techniques have provided a practical means for producing wide-bandwidth monolithic crystal filters that have relatively large passbands, for example, 30 KHz, and relatively high filter center frequencies, for example, 45 MHz.

SUMMARY OF THE INVENTION

It is an object of the present invention to provide an improved wide-bandwidth monolithic crystal filter that is relatively easy to fabricate.

It is another object of the present invention to provide an improved wide-bandwidth monolithic crystal filter that is operable at relatively high overtone frequencies.

Briefly described, the invention is a wide-bandwidth two-pole monolithic crystal filter having a predetermining center frequency, that includes a piezoelectric substrate, an output electrode, a plurality of input electrodes orthogonally disposed with respect to the output electrode, and common electrodes disposed opposite the input and output electrodes. The input and output electrodes are disposed along orthogonal crystallographic axes of the piezoelectric substrate, which may be, for example, quartz. The input and output electrodes are turned to the filter center frequency. The substrate has a predetermined fundamental frequency that is greater than the filter center frequency. According to a further embodiment of the present invention, the electrodes may be formed in the shape of a right-angled parallelogram and arranged such that one edge of each input electrode is parallel to an edge of the output electrode.

DETAILED DESCRIPTION OF THE PREFERRED EMBODIMENTS

Figure 1:
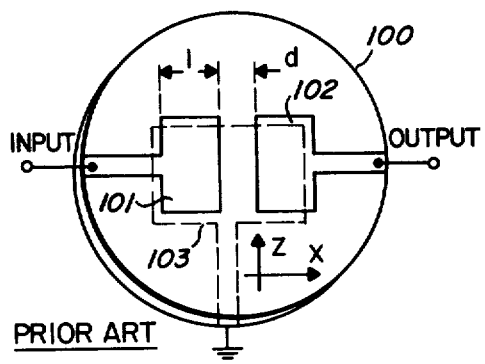
FIG. 1 shows a prior art two-pole monolithic crystal filter.

The characteristics of the prior-art two-pole monolithic crystal filter of FIG. 1 are well known in the art, for example, see U.S. Pat. Nos. 3,517,350, 3,525,944 and 3,564,463. The input and output electrodes 101 and 102 are preferably aligned along a crystallographic axis of the piezoelectric substrate 100, which is typically quartz. The acoustic coupling, and thus the filter bandwidth, may typically be increased by decreasing the distance, d, between the input electrode 101 and output electrode 102. The acoustic coupling along the X axis, $K_x$, may be defined by the following equation:

$$K_x = C_x(3/2n^2)(C_{11}/C_{66})(t^2/[2l_x + d_x + x]^2)e^{-2.28\sqrt{\Delta}\ (d_x/t)} \tag{1}$$

Where $C_x$ is a constant greater than one derived from emperical data, n is the overtone mode, $C_{11}$ is $8.67 \times 10^{10}$ Newtons/m², $C_{66}$ is $2.8988 \times 10^{10}$ Newtons/m², t is the thickness of the substrate, $l_x$ and $d_x$ are distances with respect to the X axis, x is 2.09t, and $\Delta$ is the plateback. Equation (1) is modeled after the coupling equation developed by William D. Beaver and published in his doctoral thesis entitled, "Theory and Design Principles of the Monolithic Crystal Filter", Lehigh University, Pennsylvania, 1967. The acoustic coupling along the Z axes, $K_z$, may be described by the following equation modeled after equation (1):

$$K_z = C_z(3/2n^2)(C_{55}/C_{66})(t^2/2l_z + d_z + z]e^{-2.28n\sqrt{\Delta}\ (d_z/t)} \tag{2}$$

Where $C_z$ is a constant greater than one derived from emperical data, $C_{55}$ is $6.8827 \times 10^{10}$ Newtons/m², $l_z$ and $d_z$ are distances with respect to the Z axis, z is 8.78t, and other variables are defined as in equation (1). Thus, both equations (1) and (2), modeled after the equations of William D. Beaver, accurately characterize the acoustic coupling emperically measured along the X and Z axes of a quartz substrate, respectively.

Figure 2:
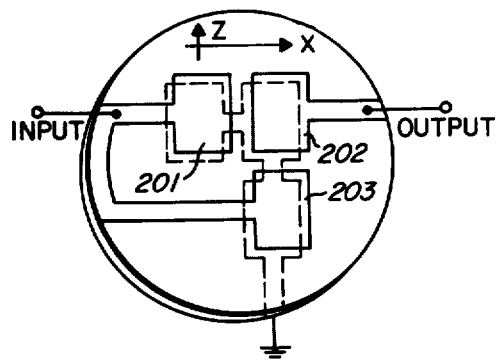
FIG. 2 shows a two-pole monolithic crystal filter embodying the present invention.

In the FIG. 2, the filter illustrated, while still a two-pole monolithic crystal filter, harnesses both the coupling along the X axis, $K_x$, and the coupling along the Z axis $K_z$. Thus for FIG. 2, the composite coupling $K_c$ may be characterized by the following equation:

$$K_c = (K_x + K_z)K_o; \tag{3}$$

where small $K_o$ is a constant less than one derived from emperical data. Thus if $K_x$ is 10 KHz, and $K_z$ is 10 KHz and $K_o$ is 0.75, then the composite coupling $K_c$ is 15 KHz, or 5 KHz more than the coupling obtainable along the X axis or Z axis individually.

Figure 3:
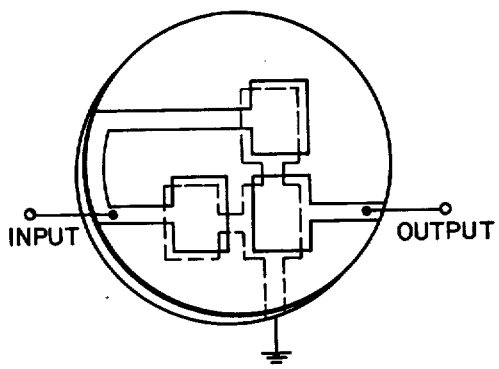
FIG. 3 shows another two-pole monolithic crystal filter embodying the present invention.
Figure 5:
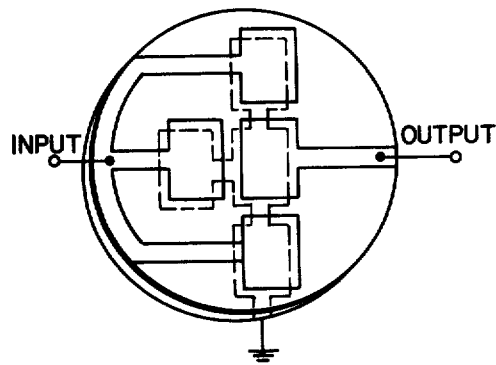
FIG. 5 shows yet another two-pole monolithic crystal filter embodying the present invention.
Figure 4:
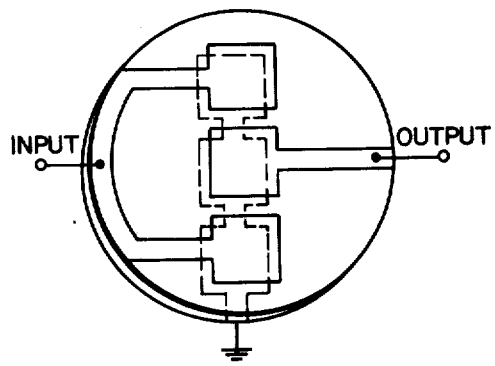
FIG. 4 shows still another two-pole monolithic crystal filter embodying the present invention.

Similar equations to equation (3) can be provided for the crystal filters illustrated in FIGS. 3, 4 and 5. Thus, the composite coupling is the sum of the coupling from each input electrode to the output electrode times a constant factor less than one. As a result, increased coupling and correspondingly increased bandwidths may now be obtained, which before were physically not obtainable by moving the input electrode closer to the output electrode. Furthermore, overtone mode operation may now be practically realized without the necessity of placing the input electrode extremely close to the output electrode. Thus, wide-bandwidth overtone monolithic crystal filters may now be fabricated at relatively high frequencies. For example, a monolithic crystal filter having a third overtone center frequency at 45 MHz and a bandwidth of 30 KHz may now be fabricated in accordance with the present invention.

Figure 6:
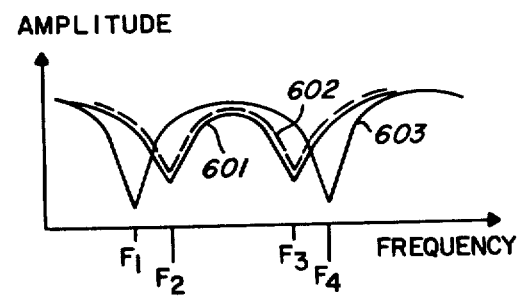
FIG. 6 shows a frequency response demonstrating the inter-electrode acoustic coupling for the monolithic crystal filter of FIG. 2, wherein the output electrode is connected to electrical ground.

FIG. 6 illustrates a representative acoustical coupling response for the crystal filter of FIG. 2, demonstrating the coupling between electrodes 201, 202 and 203. Waveform 601 is the acoustical coupling response for electrode 201 with electrode 203 tuned out and electrode 202 shorted out. The acoustic coupling for waveform 601 is approximately $F_3$-$F_2$. Waveform 602 is the acoustic coupling response for electrode 203 with electrode 201 tuned out and electrode 202 shorted out. The coupling for waveform 602 is also approximately $F_3$-$F_2$. Waveform 603 is the acoustic coupling response for electrodes 201 and 203 with electrode 202 shorted out. The acoustic coupling for waveform 603 is approximately $F_4$-$F_1$. The waveforms 601 and 602 are substantially identical and are shown separated only for the purposes of clarity. Also, the waveforms 601, 602 and 603 ave substantially the same peak value at their maximum point between $F_2$ and $F_3$ and are shown separated only for the purposes of clarity. Thus, waveform 603 illustrates an increase in acoustic coupling by as much as 50 to 60 percent over the individual acoustic coupling provided by the input electrodes 201 and 203.

Moreover, wide-bandwidth monolithic crystal filters embodying the present invention may be advantageously utilized in many different applications, for example, such as intermediate-frequency filters in radio receivers. Furthermore, the illustrative two-pole crystal filters of FIGS. 1, 2, 3, 4 and 5 may be cascaded with each other or to provide a wide-bandwidth four-pole monolithic crystal filter.

We claim:

1. A wide-bandwidth two-pole monolithic crystal filter having a predetermined center frequency, comprising:
    a piezoelectric substrate having first and second flat, parallel surfaces, the substrate having a predetermined fundamental frequency that is greater than the filter center frequency;
    output electrode means disposed on the first surface of the substrate, the output electrode means tuned to the filter center frequency;
    a plurality of input electrode means, each input electrode means predeterminedly disposed on the first surface along the crystallographic axes of the substrate in orthogonal relationship with respect to the output electrode means, each input electrode means being tuned to the filter center frequency; and
    common electrode means disposed on the second surface of the substrate in opposing relationship with said input and output electrode means.

2. The monolithic crystal filter according to claim 1, wherein the piezoelectric crystal substrate is quartz, and said plurality of input electrode means and output electrode means are orthogonally disposed with respect to the "X" and "Z" crystallographic axes of the quartz substrate.

3. The monolithic crystal filter according to claim 2, wherein the plurality of input electrode means and output electrode means are formed in the shape of a right angled parallelogram, each of said input electrode means arranged such that one edge thereof is parallel to, and predeterminedly spaced from, a corresponding edge of the output electrode means.

4. The monolithic crystal filter according to claim 3, wherein the plurality of input electrode means includes at least first and second input electrodes electrically coupled in parallel, and the output electrode means includes at least one output electrode, the first input electrode and the output electrode being disposed along the "X" crystallographic axis of the quartz substrate, and the second input electrode being disposed along the "Z" crystallographic axis of the quartz substrate.

5. The monolithic crystal filter according to claim 3, wherein the plurality of input electrode means includes at least first, second and third input electrodes electrically coupled in parallel, and the output electrode means includes at least one output electrode, the first and second input electrodes being disposed on opposite sides of the output electrode along the "X" crystallographic axis of the quartz substrate, and the third input electrode being disposed along the "Z" crystallographic axis of the quartz substrate.

6. The monolithic crystal filter according to claim 3, wherein the plurality of input electrode means includes at least first, second and third input electrodes electrically coupled in parallel, and the output electrode means includes at least one output electrode, the first and second input electrodes being disposed on opposite sides of the output electrode along the "Z" crystallographic axis of the quartz substrate, and the third input electrode being disposed along the "X" crystallographic axis of the quartz substrate.

7. The monolithic crystal filter according to claim 3, wherein the plurality of input electrodes includes at least first, second, third and fourth input electrodes electrically coupled in parallel, and the output electrode means includes at least one output electrode, the first and second input electrodes being disposed on opposite sides of the output electrode along the "X" crystallographic axis of the quartz substrate, and the third and fourth input electrodes being disposed on opposite sides of the output electrode along the "Z" crystallographic axis.

8. A wide-bandwidth two-pole monolithic crystal filter having a predetermined center frequency, comprising:
    a piezoelectric substrate having first and second flat, parallel surfaces, the substrate having a predetermined fundamental frequency that is greater than the filter center frequency;
    output electrode-pair means predeterminedly disposed on the surfaces of the substrate, the output electrode-pair means being tuned to the filter center frequency; and
    a plurality of input electrode-pair means, each input electrode-pair means being predeterminedly disposed on the substrate surfaces along the crystallographic axes of the substrate in orthogonal relationship with respect to the output electrode-pair means, each input electrode-pair means being tuned to the filter center frequency.

* * * * *